United States Patent
Wang et al.

(10) Patent No.: US 8,383,480 B1
(45) Date of Patent: Feb. 26, 2013

(54) METHOD FOR FORMING SEMICONDUCTOR STRUCTURE AND METHOD FOR FORMING MEMORY USING THE SAME

(75) Inventors: Chih-Ming Wang, Tainan (TW);
Ping-Chia Shih, Tainan (TW);
Chi-Cheng Huang, Kaohsiung (TW);
Hsiang-Chen Lee, Kaohsiung (TW);
Chih-Hung Lin, Hsinchu (TW)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 13/295,191

(22) Filed: Nov. 14, 2011

(51) Int. Cl.
*H01L 21/336* (2006.01)
(52) U.S. Cl. .......................... 438/261; 438/396; 438/738
(58) Field of Classification Search .................. 438/261, 438/396, 738
See application file for complete search history.

(56) References Cited

U.S. PATENT DOCUMENTS
6,706,601 B1  3/2004  Liu et al.

*Primary Examiner* — Jarrett Stark
*Assistant Examiner* — John M Parker
(74) *Attorney, Agent, or Firm* — WPAT PC; Justin King

(57) ABSTRACT

A method for forming a semiconductor structure includes following steps. A substrate structure is provided. The substrate structure includes a semiconductor substrate, a first oxide-nitride-oxide (ONO) layer, and a second ONO layer. The semiconductor substrate has first and second surfaces opposite to each other. The first ONO layer includes a first oxide layer, a first nitride layer and a second oxide layer formed on the first surface in sequence. The second ONO layer includes a third oxide layer, a second nitride layer and a fourth oxide layer formed on the second surface in sequence. A nitride mask layer is formed on the first ONO layer. The fourth oxide layer is removed. The second nitride layer and the nitride mask layer are removed. The second oxide layer and the third oxide layer are removed. A fifth oxide layer is formed on the first nitride layer.

19 Claims, 4 Drawing Sheets

METHOD FOR FORMING SEMICONDUCTOR STRUCTURE AND METHOD FOR FORMING MEMORY USING THE SAME

BACKGROUND

1. Technical Field

The disclosure relates in general to a method for forming a semiconductor structure and a method for forming a memory using the same, and more particularly to a method for forming a semiconductor structure comprising an oxide-nitride-oxide layer formed only on a single surface of a semiconductor substrate and a method for forming a memory using the same.

2. Description of the Related Art

In a conventional semiconductor technique, an oxide-nitride-oxide layer is formed by a tube furnace process. The tube furnace process results in oxide-nitride-oxide layers simultaneously formed on a front surface and a back surface of the wafer. A subsequent process for forming a memory only treats the oxide-nitride-oxide layer on the front surface of the wafer, while the oxide-nitride-oxide layer on the back surface of the wafer is remained.

However, the oxide-nitride-oxide layer on the back surface of the wafer obstructs a heat energy transmission. It results in misjudging by a system for a rapid thermal process (RTP) performed later that a temperature of the wafer is insufficient. Therefore, the process temperature is heated to an over-high temperature. A finally-formed memory would have a resistance higher than a standard range. Thus, a product yield would be decreased. In some terrible cases, the product is scrapped and not shipped.

SUMMARY

A method for forming a semiconductor structure is provided. The method comprises following steps. A substrate structure is provided. The substrate structure comprises a semiconductor substrate, a first oxide-nitride-oxide (ONO) layer, and a second ONO layer. The semiconductor substrate has a first surface and a second surface opposite to each other. The first ONO layer comprises a first oxide layer, a first nitride layer and a second oxide layer formed on the first surface in sequence. The second ONO layer comprises a third oxide layer, a second nitride layer and a fourth oxide layer formed on the second surface in sequence. A nitride mask layer is formed on the first ONO layer. The fourth oxide layer is removed. The second nitride layer and the nitride mask layer are removed. The second oxide layer and the third oxide layer are removed. A fifth oxide layer is formed on the first nitride layer.

A method for forming a memory is provided. The method comprises following steps. A substrate structure is provided. The substrate structure comprises a semiconductor substrate, a first ONO layer and a second ONO layer. The semiconductor substrate has a first surface and a second surface opposite to each other. The first ONO layer comprises a first oxide layer, a first nitride layer and a second oxide layer formed on the first surface in sequence. The second ONO layer comprises a third oxide layer, a second nitride layer and a fourth oxide layer formed on the second surface in sequence. A nitride mask layer is formed on the first ONO layer. The fourth oxide layer is removed. The second nitride layer and the nitride mask layer are removed. The second oxide layer and the third oxide layer are removed. A fifth oxide layer is formed on the first nitride layer. The first oxide layer, the first nitride layer and the fifth oxide layer form a third ONO layer. The third ONO layer is patterned for forming a patterned third ONO layer. An electrode layer is formed on the patterned third ONO layer. A source and a drain are formed in the semiconductor substrate respectively on opposite sides of the patterned third ONO layer.

DETAILED DESCRIPTION

FIG. 1A to FIG. 1F show a process for forming semiconductor structure according to one embodiment of the present disclosure.

Figure 1A:
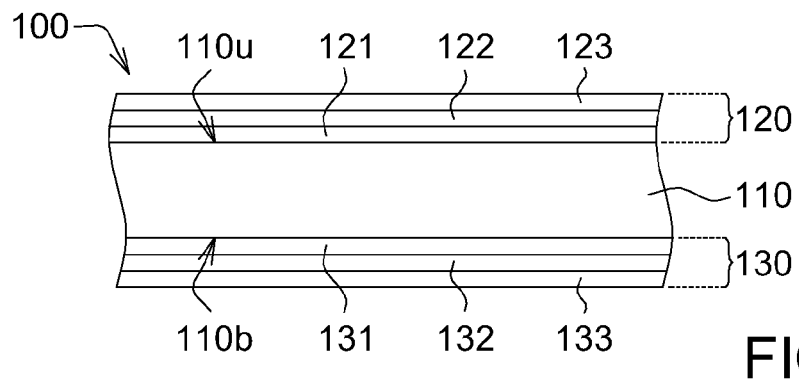
FIG. 1A to FIG. 1F show a process for forming semiconductor structure according to one embodiment of the present disclosure.

As shown in FIG. 1A, substrate structure 100 is provided. The substrate structure 100 comprises a semiconductor substrate 110, a first oxide-nitride-oxide (ONO) layer 120 and a second ONO layer 130.

The semiconductor substrate 110 has a first surface 110$u$ and a second surface 110$b$ opposite to each other. The semiconductor substrate 110 comprises silicon, such as P-type silicon substrate.

The first ONO layer 120 is formed on the first surface 110$u$ of the semiconductor substrate 110. The first ONO layer 120 comprises a first oxide layer 121, a first nitride layer 122 and a second oxide layer 123. The first oxide layer 121, the first nitride layer 122 and the second oxide layer 123 are formed on the first surface 110$u$ of the semiconductor substrate 110 in sequence.

The second ONO layer 130 is formed on the second surface 110$b$ of the semiconductor substrate 110. The second ONO layer 130 comprises a third oxide layer 131, a second nitride layer 132 and a fourth oxide layer 133. The third oxide layer 131, the second nitride layer 132 and the fourth oxide layer 133 are formed on the second surface 110$b$ of the semiconductor substrate 110 in sequence.

In one embodiment, the first ONO layer 120 and the second ONO layer 130 are formed in a tube furnace process. In the tube furnace process, the first oxide layer 121 and the third oxide layer 131 are formed simultaneously, the first nitride layer 122 and the second nitride layer 132 are formed simultaneously, and the second oxide layer 123 and the fourth oxide layer 133 are formed simultaneously.

Figure 1B:
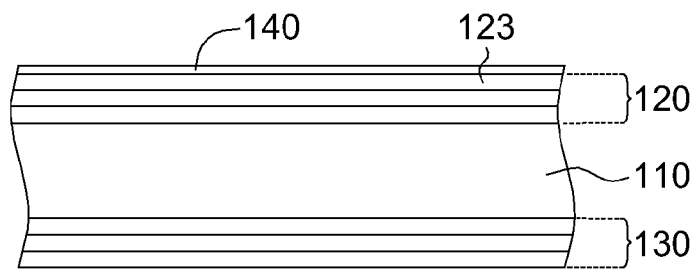

As shown in FIG. 1B, a nitride mask layer 140 is formed on the second oxide layer 123 of the first ONO layer 120. In this embodiment, for example, the nitride mask layer 140 is SiN. In addition, the nitride mask layer 140 may have a thickness of about 120 angstrom (Å) to 200 angstrom. However, embodiments of the present disclosure are not limited thereto. In one embodiment, the thickness of the nitride mask layer 140 may be adjusted according to a thickness of the second nitride layer 132 and an etching selection ratio of the second nitride layer 132 to the nitride mask layer 140 (for example, in the hot phosphoric acid). For example, the thickness and an etching rate of the nitride mask layer 140 are T1 and R1, respectively. The thickness and an etching rate of the second nitride layer 132 are T2 and R2, respectively. The thickness T1 of the nitride mask layer 140 is equal to T2×(R2/R1). In one embodiment, as the nitride mask layer 140 and the second nitride layer 132 substantially have the same etching rate, the nitride mask layer 140 and the second nitride layer 132 substantially have the same thickness, so as to benefit simultaneously removing the nitride mask layer 140 and the second nitride layer 132.

Figure 1C:
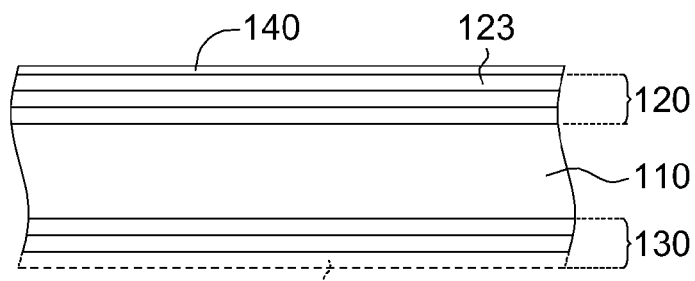

As shown in FIG. 1C, the fourth oxide layer 133 of the second ONO layer 130 may be removed by using a diluted hydrofluoric acid (diluted HF, DHF). The nitride mask layer 140 protecting the second oxide layer 123 of the first ONO layer 120 prevents it from the etching by the diluted hydrofluoric acid.

Figure 1D:
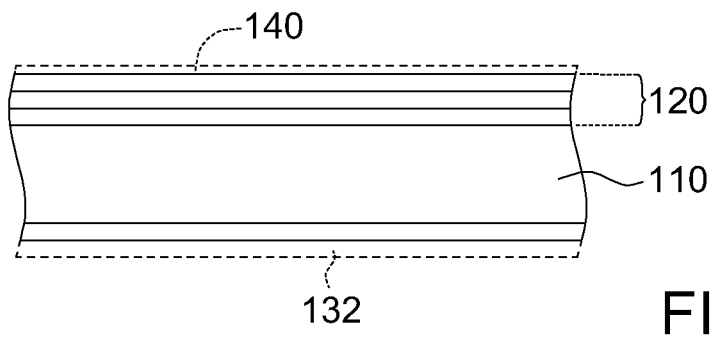

As shown in FIG. 1D, for example, the second nitride layer 132 of the second ONO layer 130 and the nitride mask layer 140 formed on the first ONO layer 120 are removed simultaneously by using a hot phosphoric acid ($H_3PO_4$). After the nitride mask layer 140 is removed, the first ONO layer 120 is exposed.

Figure 1E:
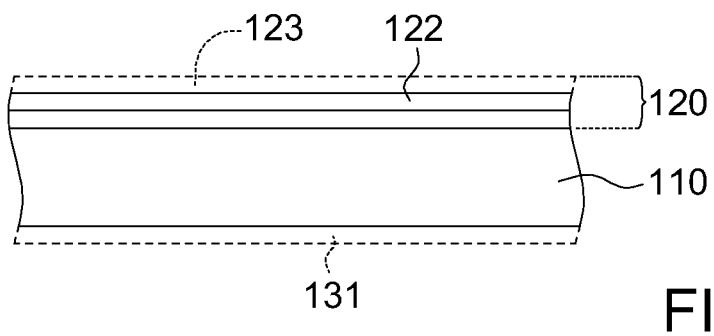

As shown in FIG. 1E, for example, the second oxide layer 123 of the first ONO layer 120 and the third oxide layer 131 of the second ONO layer 130 are removed simultaneously by using a diluted hydrofluoric acid. After this step, the whole the second ONO layer 130 on the second surface 110b of the semiconductor substrate 110 is not existed.

The second ONO layer 130 on the second surface 110b of the semiconductor substrate 110 is removed completely. Therefore, a rapid thermal process (RTP) performed later can be prevented from heating to an over-high temperature resulted from a misjudged water temperature obtained by a process system. The rapid thermal process herein may be a thermal process for forming, for example, a lightly doped diffusion (LDD), a source/drain, a salicide, etc.

Figure 1F:
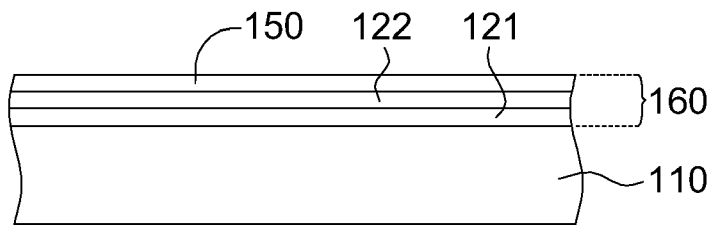

As shown in FIG. 1F, for example, a fifth oxide layer 150 is formed on the first nitride layer 122 of the first ONO layer 120 by a method using an in-situ stream generator (ISSG) or other oxidation processes. For example, the fifth oxide layer 150 may be used as a gate oxide layer.

The first oxide layer 121, the first nitride layer 122 and the fifth oxide layer 150 form a third ONO layer 160.

For preventing the semiconductor substrate 110 or the film (for example, the first nitride layer 122 in FIG. 1E) on the semiconductor substrate 110 from an native oxide resulting from exposing to air or a oxygen containing environment, affecting quality of the sequentially formed film (for example, the fifth oxide layer 150 in FIG. 1F) or the third ONO layer 160, in embodiments, after the film (for example, the second oxide layer 123 in FIG. 1E) is removed by using the DHF, the semiconductor substrate 110 is got into the ISSG for forming the next film (for example, the fifth oxide layer 150 in FIG. 1F) as soon as possible.

The method for forming the semiconductor structure can be applied for various semiconductor devices having an ONO layer structure, for example, comprising a memory such as a flash memory, a dynamic random access memory, DRAM or a SONOS memory. The following illustrates a method for forming a memory from the described semiconductor structure. In the embodiment, the memory is a SONOS memory.

FIG. 2A to FIG. 2E illustrate a process for forming a memory according one embodiment of the present disclosure.

Figure 2A:
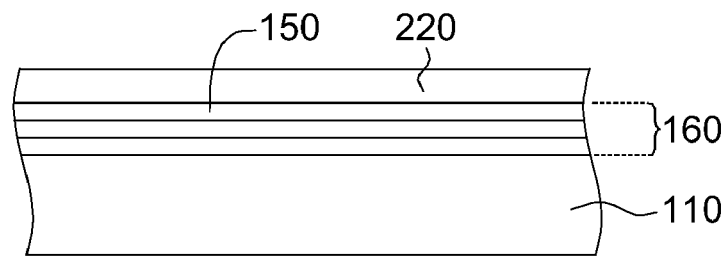
FIG. 2A to FIG. 2E illustrate a process for forming a memory according one embodiment of the present disclosure.

As shown in FIG. 2A, an electrode layer 220 is formed on the fifth oxide layer 150 by a method comprising a CVD method, a PVD method, etc. In addition, the electrode layer 220 may comprise a metal, a polysilicon, or a silicide.

Figure 2B:
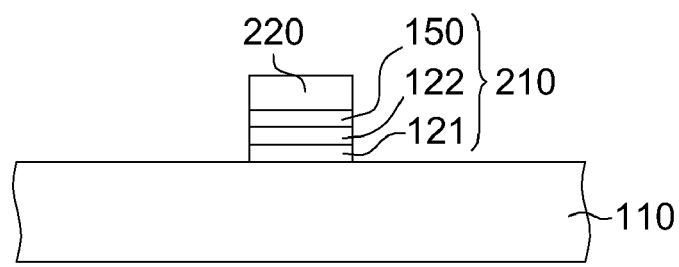

As shown in FIG. 2B, for example, the electrode layer 220, the fifth oxide layer 150, the first nitride layer 122 and the first oxide layer 121 are patterned by a photolithography process. The patterned fifth oxide layer 150, the patterned first nitride layer 122 and the patterned first oxide layer 121 form a patterned third ONO layer 210. The patterned first oxide layer 121 comprising a silicon oxide ($SiO_2$) may be functioned as a tunneling layer. The first nitride layer 122 comprising a silicon nitride may be functioned as a charge trapping layer. The fifth oxide layer 150 comprising a silicon oxide ($SiO_2$) may be functioned as a blocking layer.

Figure 2C:
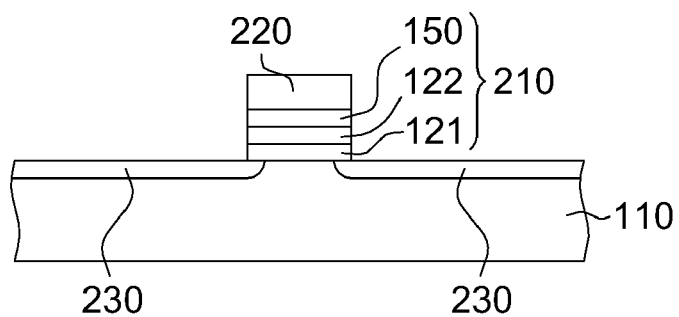

As shown in FIG. 2C, a doped region 230 may be formed in the semiconductor substrate 110 on opposite sides of the patterned third ONO layer 210 by anion implantation process using the electrode layer 220 and the patterned third ONO layer 210 as a mask. The doped region 230 may be a lightly doped region, such as an N-type lightly doped region.

Figure 2D:
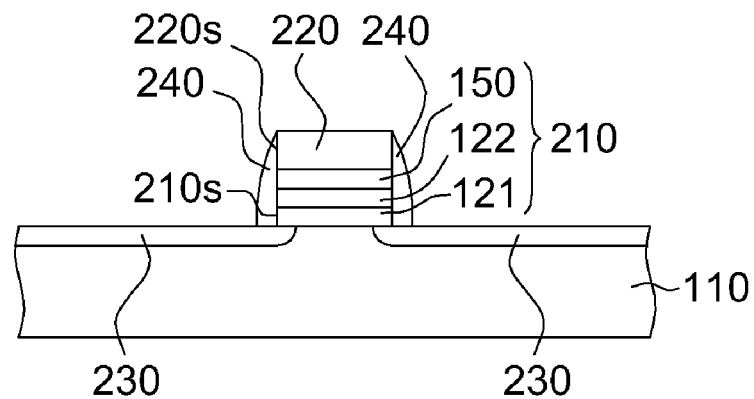

As shown in FIG. 2D, a spacer 240 is formed on a sidewall 220s of the electrode layer 220 and a sidewall 210s of the patterned third ONO layer 210. The spacer 240 has an insulating material or a dielectric material, for example, comprising silicon oxide ($SiO_2$) or silicon nitride. In this embodiment, the spacer 240 is formed by removing a part of a film conformally formed on the structure as shown in FIG. 2C by an etching step. A remained part of the film forms the spacer 240. In other embodiments, the spacer 240 may be omitted.

Figure 2E:
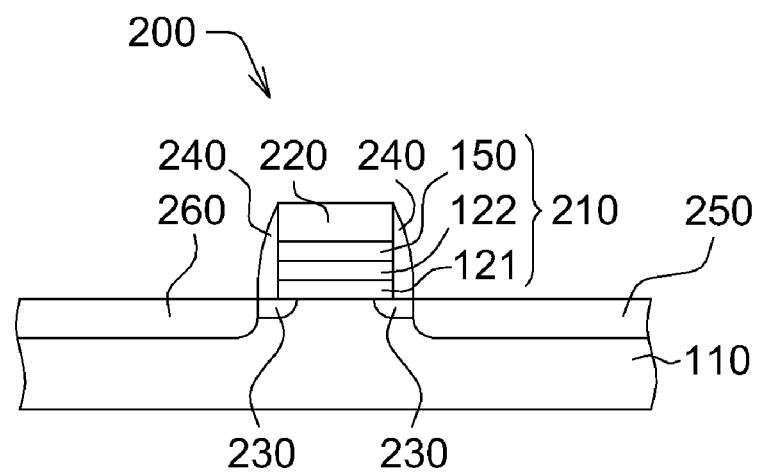

As shown in FIG. 2E, for example, a doped region 250 and a doped region 260 are formed in the semiconductor substrate 110 by an anion implantation process using the spacer 240 as a mask. In this embodiment, the doped region 250 and the doped region 260 are heavily doped regions, such as N-type heavily doped regions. In one embodiment, after the doped region 250 and the doped region 260 are formed, a RTP process may be performed for activating or diffusing doped ions properly. The doped region 250 and the doped region 260 on the opposite sides of the patterned third ONO layer 210 may be functioned as a source and a drain, respectively. Finally, a memory 200 is completed.

Accordingly, the second ONO layer 130 (FIG. 1A) on the second surface 110b of the semiconductor substrate 110 is removed entirely. Therefore, a rapid thermal process (RTP) performed later can be prevented from heating to an over-high temperature resulted from a misjudged water temperature obtained by a process system. As such, the finished memory 200 will not have an over-high resistance. In addition, a yield rate and an efficiency of the memory 200 can be improved.

While the disclosure has been described by way of example and in terms of the exemplary embodiment(s), it is to be understood that the disclosure is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A method for forming a semiconductor structure, comprising:
   providing a substrate structure, wherein the substrate structure comprises a semiconductor substrate, a first oxide-nitride-oxide (ONO) layer, and a second ONO layer, the semiconductor substrate has a first surface and a second surface opposite to each other, the first ONO layer comprises a first oxide layer, a first nitride layer and a second oxide layer formed on the first surface in sequence, the second ONO layer comprises a third oxide layer, a second nitride layer and a fourth oxide layer formed on the second surface in sequence;
   forming a nitride mask layer on the first ONO layer;
   removing the fourth oxide layer;
   removing the second nitride layer and the nitride mask layer;
   removing the second oxide layer and the third oxide layer; and
   forming a fifth oxide layer on the first nitride layer.

2. The method for forming the semiconductor structure according to claim 1, wherein the second nitride layer and the nitride mask layer are removed simultaneously.

3. The method for forming the semiconductor structure according to claim 1, wherein the second oxide layer and the third oxide layer are removed simultaneously.

4. The method for forming the semiconductor structure according to claim 1, wherein the second nitride layer and the nitride mask layer are removed simultaneously, and the second oxide layer and the third oxide layer are removed simultaneously.

5. The method for forming the semiconductor structure according to claim 1, wherein the first oxide layer, the first nitride layer and the fifth oxide layer form a third ONO layer.

6. The method for forming the semiconductor structure according to claim 1, wherein the nitride mask layer is SiN.

7. The method for forming the semiconductor structure according to claim 1, wherein the nitride mask layer has a thickness of 120 angstrom to 200 angstrom.

8. The method for forming the semiconductor structure according to claim 1, wherein the fourth oxide layer is removed by using a hydrofluoric acid.

9. The method for forming the semiconductor structure according to claim 1, wherein the second nitride layer and the nitride mask layer are removed by using a hot phosphoric acid.

10. The method for forming the semiconductor structure according to claim 1, wherein the second oxide layer and the third oxide layer are removed by using a hydrofluoric acid.

11. A method for forming a memory, comprising:
providing a substrate structure, wherein the substrate structure comprises a semiconductor substrate, a first ONO layer and a second ONO layer, the semiconductor substrate has a first surface and a second surface opposite to each other, the first ONO layer comprises a first oxide layer, a first nitride layer and a second oxide layer formed on the first surface in sequence, the second ONO layer comprises a third oxide layer, a second nitride layer and a fourth oxide layer formed on the second surface in sequence;
forming a nitride mask layer on the first ONO layer;
removing the fourth oxide layer;
removing the second nitride layer and the nitride mask layer;
removing the second oxide layer and the third oxide layer;
forming a fifth oxide layer on the first nitride layer, wherein the first oxide layer, the first nitride layer and the fifth oxide layer form a third ONO layer;
patterning the third ONO layer for forming a patterned third ONO layer;
forming an electrode layer on the patterned third ONO layer; and
forming a source and a drain in the semiconductor substrate respectively on opposite sides of the patterned third ONO layer.

12. The method for forming the memory according to claim 11, wherein the second nitride layer and the nitride mask layer are removed simultaneously.

13. The method for forming the memory according to claim 11, wherein the second oxide layer and the third oxide layer are removed simultaneously.

14. The method for forming the memory according to claim 11, wherein the second nitride layer and the nitride mask layer are removed simultaneously, and the second oxide layer and the third oxide layer are removed simultaneously.

15. The method for forming the memory according to claim 11, wherein the nitride mask layer is SiN.

16. The method for forming the memory according to claim 11, wherein the nitride mask layer has a thickness of 120 angstrom to 200 angstrom.

17. The method for forming the memory according to claim 11, wherein the fourth oxide layer is removed by using a hydrofluoric acid.

18. The method for forming the memory according to claim 11, wherein the second nitride layer and the nitride mask layer are removed by using a hot phosphoric acid.

19. The method for forming the memory according to claim 11, wherein the second oxide layer and the third oxide layer are removed by using a hydrofluoric acid.

* * * * *